(12) United States Patent
Wu et al.

(10) Patent No.: US 12,363,941 B2
(45) Date of Patent: Jul. 15, 2025

(54) GAA LDMOS STRUCTURE FOR HV OPERATION

(71) Applicant: Taiwan Semiconductor Manufacturing Company, Ltd., Hsinchu (TW)

(72) Inventors: Hong-Shyang Wu, Taipei (TW); Kuo-Ming Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 467 days.

(21) Appl. No.: 17/750,907

(22) Filed: May 23, 2022

(65) Prior Publication Data

US 2023/0275149 A1    Aug. 31, 2023

Related U.S. Application Data

(60) Provisional application No. 63/314,521, filed on Feb. 28, 2022.

(51) Int. Cl.
*H10D 30/65* (2025.01)
*H10D 30/01* (2025.01)
*H10D 62/10* (2025.01)
*H10D 62/17* (2025.01)

(52) U.S. Cl.
CPC ....... *H10D 30/658* (2025.01); *H10D 30/0289* (2025.01); *H10D 62/116* (2025.01); *H10D 62/393* (2025.01)

(58) Field of Classification Search
None
See application file for complete search history.

(56) References Cited

U.S. PATENT DOCUMENTS

| | | | |
|---|---|---|---|
| 7,888,732 B2 * | 2/2011 | Denison | H01L 29/66704 257/330 |
| 9,842,903 B2 * | 12/2017 | Lu | H01L 21/76232 |
| 11,211,477 B2 * | 12/2021 | Yu | H01L 29/7853 |
| 2016/0276476 A1 * | 9/2016 | Fang | H01L 29/4236 |
| 2021/0043488 A1 | 2/2021 | Toshima et al. | |
| 2021/0399087 A1 | 12/2021 | Murukesan et al. | |

* cited by examiner

*Primary Examiner* — Michelle Mandala
(74) *Attorney, Agent, or Firm* — Eschweiler & Potashnik, LLC

(57) ABSTRACT

A gate-all-around (GAA) high voltage transistor of the laterally double-diffused metal-oxide semiconductor (LDMOS) type has a loop-shaped gate electrode disposed below a surface of a semiconductor substrate. The loop-shaped gate electrode surrounds a vertical channel formed by a first source/drain region, a body region, and a diffusion region. The first source/drain region is on top, the body region is in the middle, and the diffusion region is underneath. A loop-shaped shallow trench isolation (STI) region surrounds the loop-shaped gate electrode. The diffusion region begins inside the loop-shaped gate electrode, extends under the loop-shaped gate electrode and the loop-shaped STI region, and rises outside the loop-shaped STI region to join with a second source/drain region. This structure allows pitch to be reduced by 40% or linear drive current to be doubled in comparison to an asymmetric NMOS transistor providing otherwise equivalent functionality.

20 Claims, 11 Drawing Sheets

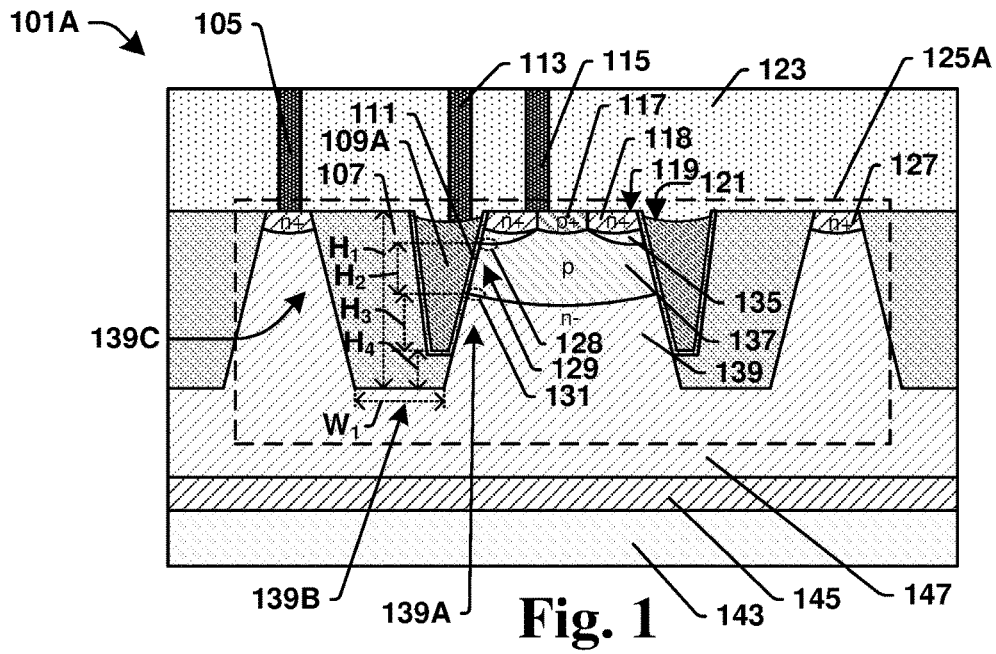
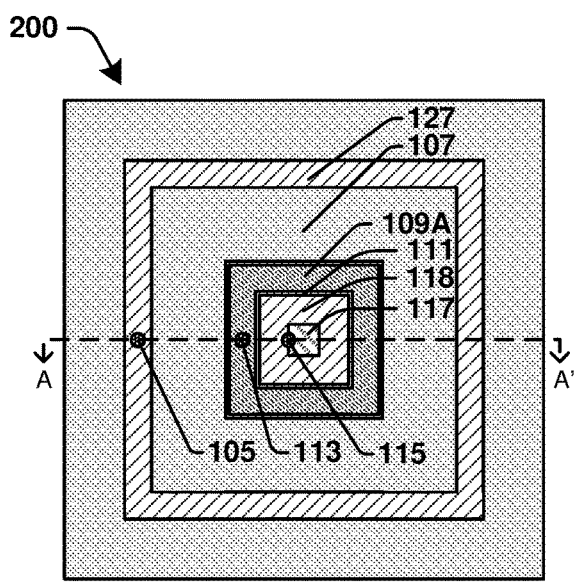
Fig. 2
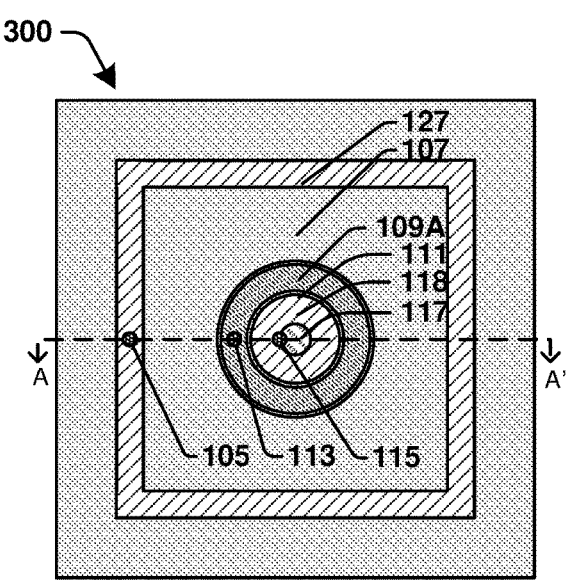
Fig. 3

GAA LDMOS STRUCTURE FOR HV OPERATION

REFERENCE TO RELATED APPLICATION

This application claims the benefit of U.S. Provisional Application No. 63/314,521, filed on Feb. 28, 2022, the contents of which are incorporated herein by reference in their entirety.

BACKGROUND

The integrated circuit (IC) manufacturing industry has experienced exponential growth over the last few decades. As ICs have evolved, functional density (i.e., the number of interconnected devices per unit chip area) has generally increased while geometry size (i.e., the smallest component that can be created) has generally decreased. Another development is BCD technology which is a combination of bipolar junction transistor (BJT) technology, complementary metal-oxide-semiconductor (CMOS) technology, and double-diffused metal-oxide-semiconductor (DMOS) technology. BCD technology allow logic, analog, and power devices to be formed on a single semiconductor chip. BCD technology creates challenges in its needs for process compatibility and for limiting the proliferation of process steps.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a cross-sectional side view of an IC device including a gate-all-around (GAA) transistor according to some aspects of the present disclosure.

FIG. 2 illustrates a plan view of the IC device of FIG. 1 in accordance with some embodiments.

FIG. 3 illustrates a plan view of the IC device of FIG. 1 in accordance with some other embodiments.

DETAILED DESCRIPTION

Figure 4:
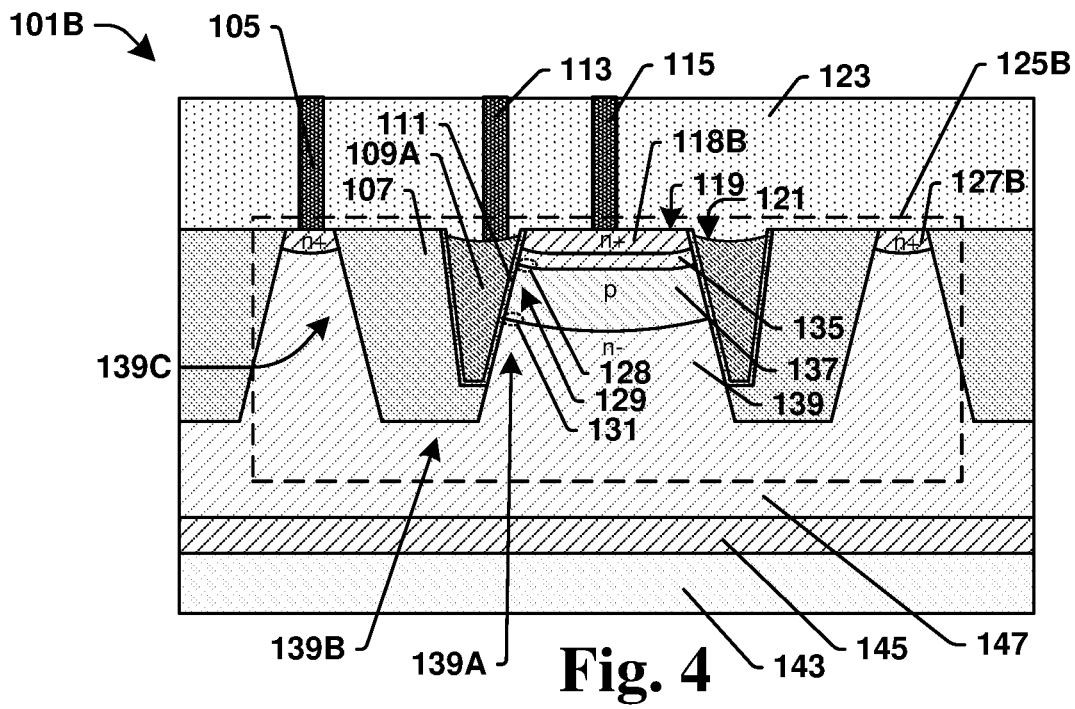
FIGS. 4-6 illustrate cross-sectional side views of IC devices including GAA transistors according to various embodiments of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a novel gate-all-around (GAA) high voltage transistor of the lateral double-diffused metal-oxide semiconductor (LDMOS) type that can be produced with minimal modifications to an exiting BCD process sequence. The novel GAA LDMOS transistor provides a substantial improvement in linear drive current for a given chip area. Pitch may be reduced by 40% or linear drive current doubled in comparison to an asymmetric N-channel metal-oxide semiconductor (NMOS) transistor providing otherwise equivalent functionality.

The novel GAA LDMOS features a loop-shaped gate electrode disposed below a surface of a semiconductor substrate. The loop-shaped gate electrode surrounds a vertical channel formed by an inner source/drain region, a body region, and a diffusion region. The inner source/drain region is surrounded by the loop-shaped gate electrode. The body region is below the inner source drain region. The diffusion region extends from below the body region, goes under the loop-shaped gate electrode, and rises to join with an outer source/drain region that is outside the loop-shaped gate electrode. In some embodiments, a shallow trench isolation (STI) region surrounds the loop-shaped gate electrode, and the diffusion region extends under the STI region as well as the loop-shaped gate electrode.

In some embodiments, the loop-shaped gate electrode has square-sided horizontal cross-sections. In some embodiments, the loop-shaped gate electrode has circular-sided horizontal cross-sections. Other shapes are possible provided the loop-shaped gate electrode surrounds an island of semiconductor substrate that provides the body region in which the vertical channel forms. The loop-shaped gate electrode is separated from the vertical channel by the width of a gate dielectric. The circular-sided structure may provide the highest efficiency. The square-sided structure may provide nearly the same efficiency and may be easier to form from a processing standpoint.

In some embodiments the loop-shaped gate electrode is in a gate stack with a gate dielectric. In some embodiments, a bottom of the gate stack is level with a bottom of the STI region. In some embodiments, a bottom of the gate stack is offset above the level of the bottom of the STI region. The vertical channel begins above the level of the bottom of the gate stack and so is even further displaced from the bottom of the STI region. Making the STI region run deeper than the gate stack and the channel facilitates giving the GAA transistor a high breakdown voltage while remaining compact.

In a process according to some aspects of the present disclosure, a loop-shaped STI region is formed in a semiconductor substrate. An etch process removes an inner portion of the STI region and to form a loop-shaped trench. The loop-shaped trench is lined with a gate oxide then filled to form the loop-shaped gate electrode. Ion implantations defines the body region, the inner source/drain region, and the outer source/drain region.

The loop-shaped STI region may have a sidewall that is sloped at a first angle relative to a surface normal of the semiconductor substrate. In some embodiments, the loop-shaped gate electrode has an inner sidewall that is also sloped at the first angle. In some embodiments, the loop-shaped gate electrode may have an outer sidewall that is sloped at a second first angle relative to the surface normal and the second angle is distinct from the first angle. These features may be the result of a process according to the present disclosure.

In some embodiments, the loop-shaped gate electrode has an upper surface that is recessed relative to an upper surface of the semiconductor substrate. In some embodiments, the gate dielectric and the loop-shaped gate electrode, which are disposed below a surface of the semiconductor substrate, are formed a gate stack from which are also formed gates that are disposed above the surface of the semiconductor substrate. In some embodiments, patterning the gate electrodes that are disposed above the upper surface of the semiconductor substrate includes an etch process that causes the loop-shaped gate electrode to be recessed below the upper surface. Forming these gates simultaneously reduces the number of processing steps.

FIG. 1 illustrates a cross-sectional view of an IC device 101A including a GAA transistor 125A according to some embodiments of the present disclosure. The GAA transistor 125A includes a source region 118, a loop-shaped gate electrode 109A, and a drain region 127. The drain region 127 is outside the loop-shaped gate electrode 109A. The source region 118 is inward of the loop-shaped gate electrode 109A. An STI region 107, which is also loop-shaped, surrounds the loop-shaped gate electrode 109A and is disposed between the loop-shaped gate electrode 109A and the drain region 127.

A gated path of conduction from the source region 118 to the drain region 127 includes a source extension region 135, a body region 137, and a drift region 139. The body region 137 provides a channel 129 between a first PN junction 128 and a second PN junction 131. A gate dielectric layer 111 separates the loop-shaped gate electrode 109A from the channel 129. The channel 129 is substantially vertical. The first PN junction 128 is between the N-doped source extension region 135 and the P-doped body region 137. The second PN junction is between the P-doped body region 137 and the N-doped drift region 139.

The drift region 139 extends from the channel 129 to the N+-doped drain region 127 and includes a portion 139A that is directly beneath the body region 137, a portion 139B that extends underneath the loop-shaped gate electrode 109A and the STI region 107, and a portion 139C that rises outside the loop-shaped gate electrode 109A and the STI region 107 to meet the drain region 127. The source extension region 135 is optional. A body contact region 117, which is P+ doped, may be butted with the source region 118, which is N+ doped. The body contact region 117 communicates with the body region 137 and therefore the channel 129.

The term "loop-shaped" means having a shape that goes all around an interior in the manner of a cylinder. The loop-shaped object separates an interior area from an exterior area. The loop may follow the path of a circle, an oval, a square, a rectangle, a hexagon, any other polygon, or an irregular shape. However, shapes providing an interior aspect ratio near 1:1 (circle or square) provide the best performance. In some embodiments, the interior aspect ratio (maximum distance across the interior to the minimum distance across the interior) is about 5:1 or less. In some embodiment, the interior aspect ratio is about 2:1 or less. In some embodiments, the interior aspect ratio is about 1:1.

FIG. 2 provides a plan view 200 illustrating an embodiment in which the loop-shaped gate electrode 109A is square-sided. The cross-sectional view of FIG. 1 corresponds to the line A-A' of plan view 200. The inner side of the loop-shaped gate electrode 109A is the side that comes closest to the channel 129 (see FIG. 1). The longest distance across the interior is from corner-to-corner in a horizontal cross-section adjacent the channel 129. The shortest distance across is from side-to-opposite side. This gives the loop-shaped gate electrode 109A in the embodiment of plan view 200 an aspect ratio of about 1.4 to 1.

FIG. 3 provides a plan view 300 illustrating an embodiment in which the loop-shaped gate electrode 109A is cylindrical. The plan view 300 also has a line A-A' to which the cross-sectional view of FIG. 1 may alternately correspond. In the embodiment of plan view 300, the inner side of the loop-shaped gate electrode 109A is circular and has an aspect ratio of 1:1.

Returning to FIG. 1, the body contact region 117, the source region 118, the source extension region 135, the body region 137, the drift region 139, and the drain region 127 are all provided by doped areas of a semiconductor substrate 143. The semiconductor substrate 143 includes a buried N-layer 145 and an upper semiconductor layer 147. The upper semiconductor layer 147 has N-type doping and includes the drift region 139. The buried N-layer 145 separates the upper semiconductor layer 147 from a bulk region of the semiconductor substrate 143 which may have p-type doping. It will be appreciated that the doping types of all the structure in FIG. 1 may be reversed. In addition, the source region 118 may be operated as a drain and the drain region 127 may be operated as a source with or without reversing the doping types.

An interlevel dielectric (ILD) layer 123 above the semiconductor substrate 143 may contain contact plugs that connect with the electrodes of the GAA transistor 125A. These may include a source contact plug 115, a gate contact plug 113, and a drain contact plug 105. The source contact plug 115 may connect with both the source region 118 and the body contact region 117. The gate contact plug 113 connects to the loop-shaped gate electrode 109A. The drain contact plug 105 connects with the drain region 127.

In some embodiments, a height $H_1$ of the STI region 107 is from about 0.1 μm to about 3 μm. In some embodiments, the height $H_1$ is from about 0.3 μm to about 1 μm. Increasing the height $H_1$ increases the breakdown voltage of the GAA transistor 125A. A height $H_1$ of about 0.3 μm or greater may be selected to achieve a breakdown voltage of about 20 V or more. In some embodiments, the width $W_1$ of the STI region 107 is from about 0.3 μm to about 10 μm. In some embodiments, the width $W_1$ is from about 1 μm to about 3 μm. Increasing the width $W_1$ also increases the breakdown voltage of the GAA transistor 125A. A width $W_1$ of about 1 μm or greater may be selected to achieve the breakdown voltage of about 20 V or more.

A height $H_2$ of the channel 129 may be less than the height $H_1$ of the STI region 107. In some embodiments, the height $H_2$ is from about 5% to about 100% the height $H_1$. In some embodiments, the height $H_2$ is from about 10% to about 90% the height $H_1$. In some embodiments, the height $H_2$ is from about 20% to about 50% the height $H_1$. The height $H_2$ affects threshold voltage, resistance, and other characteristics of the GAA transistor 125A.

When a higher threshold voltage is desired, it is advantageous to keep the loop-shaped gate electrode 109A from descending too far below the second PN junction 131. In some embodiments, a height difference $H_3$ between the second PN junction 131 and the bottom of the loop-shaped gate electrode 109A is kept small. In some embodiments, the height $H_3$ is 40% or less the height $H_2$. In some embodiments, the height $H_3$ is 20% or less the height $H_2$.

In order to control the height $H_3$, the loop-shaped gate electrode 109A may be shorter than the STI region 107 and not extend to the bottom of the STI region 107. In some embodiments, a height $H_4$ of a bottom of the loop-shaped gate electrode 109A over a bottom of the STI region 107 is at least about 10% the height $H_1$ of the STI region 107. In some embodiments, the height $H_4$ is at least about 25% the height $H_1$. In some embodiments, the height $H_4$ is at least about 50% the height $H_1$.

The loop-shaped gate electrode 109A may have an upper surface 121 that is recessed below an upper surface 119 of the semiconductor substrate 143. The recess may relate to a processing method that facilitates forming the GAA transistor 125A within the parameters of a BCD process.

FIG. 4 illustrates a cross-sectional view of an IC device 101B including a GAA transistor 125B according to another embodiment of the present disclosure. The GAA transistor 125B does not include a butted source but is otherwise like the GAA transistor 125B. The GAA transistor 125B is generally a lower voltage device than the GAA transistor 125A. For example, the GAA transistor 125B may be a 5V transistor and the GAA transistor 125A may have a threshold voltage greater than 5V. In some embodiments, the GAA transistor 125B include an inner terminal region 118B that is configured to operate as a drain and an outer terminal region 127B that is configured to operate as a source.

Figure 5:
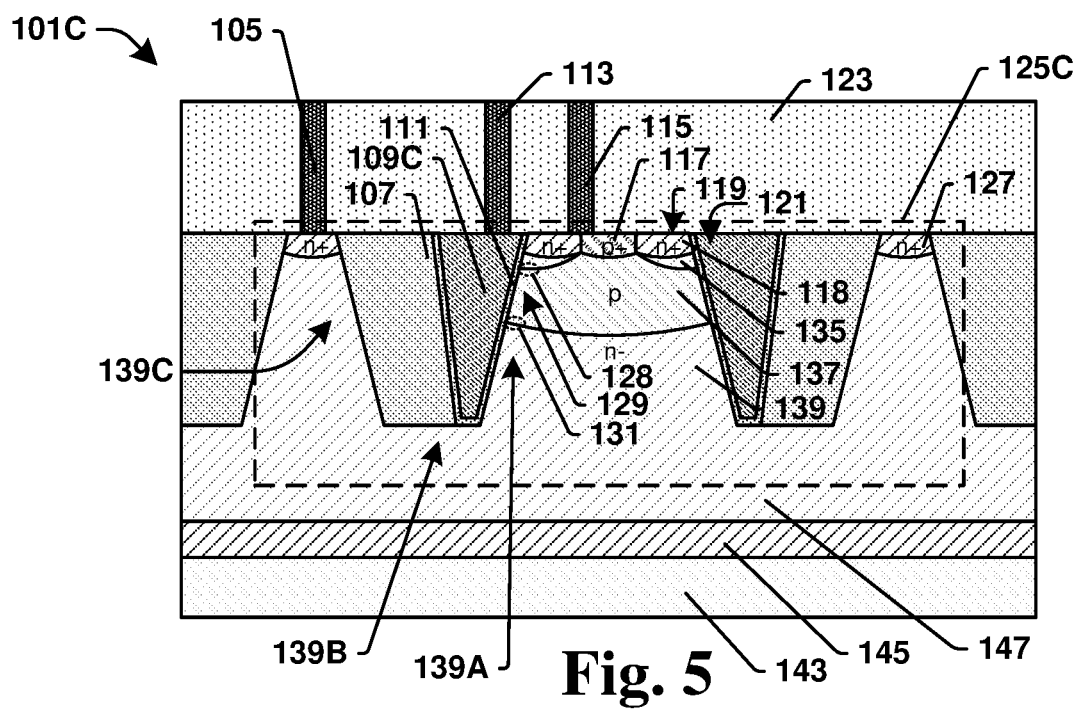

FIG. 5 illustrates a cross-sectional view of an IC device 101C including a GAA transistor 125C according to another embodiment of the present disclosure. The GAA transistor 125C may be like the GAA transistor 125A except that the GAA transistor 125C has a loop-shaped gate electrode 109C that extends nearly to the bottom of the STI region 107. The loop-shaped gate electrode 109C is displaced from alignment with the bottom of the STI region 107 by a width of the gate dielectric layer 111.

Figure 6:
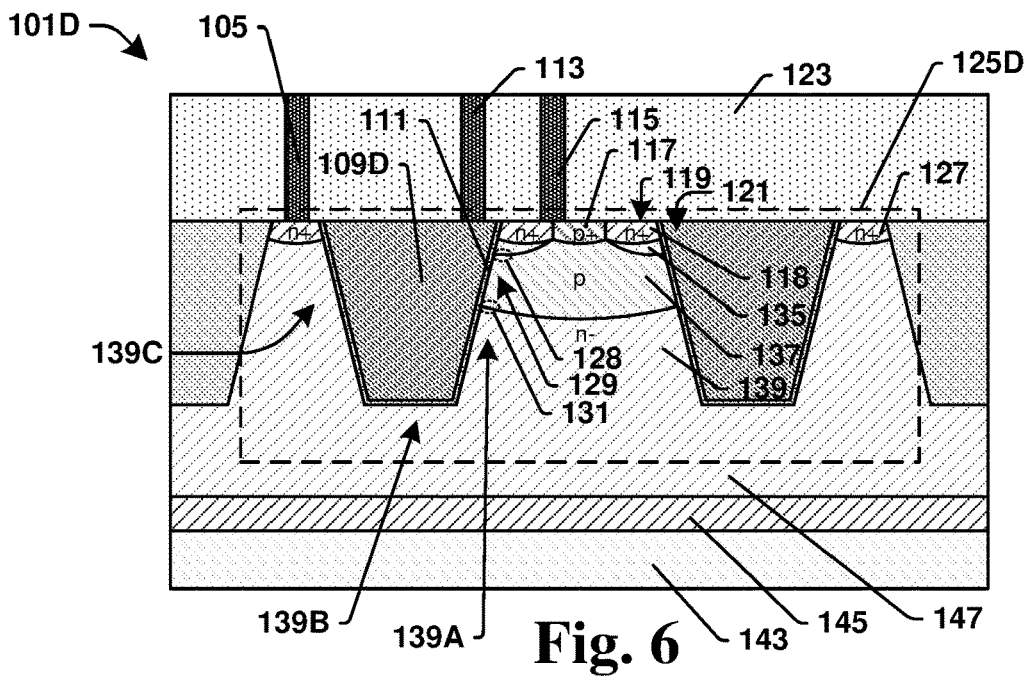

FIG. 6 illustrates a cross-sectional view of an IC device 101D including a GAA transistor 125D according to another embodiment of the present disclosure. The GAA transistor 125D may be like the GAA transistor 125C except that the GAA transistor 125C does not include the STI region 107 (see FIG. 5). The GAA transistor 125D may have a loop-shaped gate electrode 109D that is separated from the drain region 127 by the width of the gate dielectric layer 111. The structure of the GAA transistor 125D is suitable for a 5V transistor or the like but would generally have a lower threshold voltage than a transistor having the structure of the GAA transistor 125A of the GAA transistor 125C.

Figure 7:
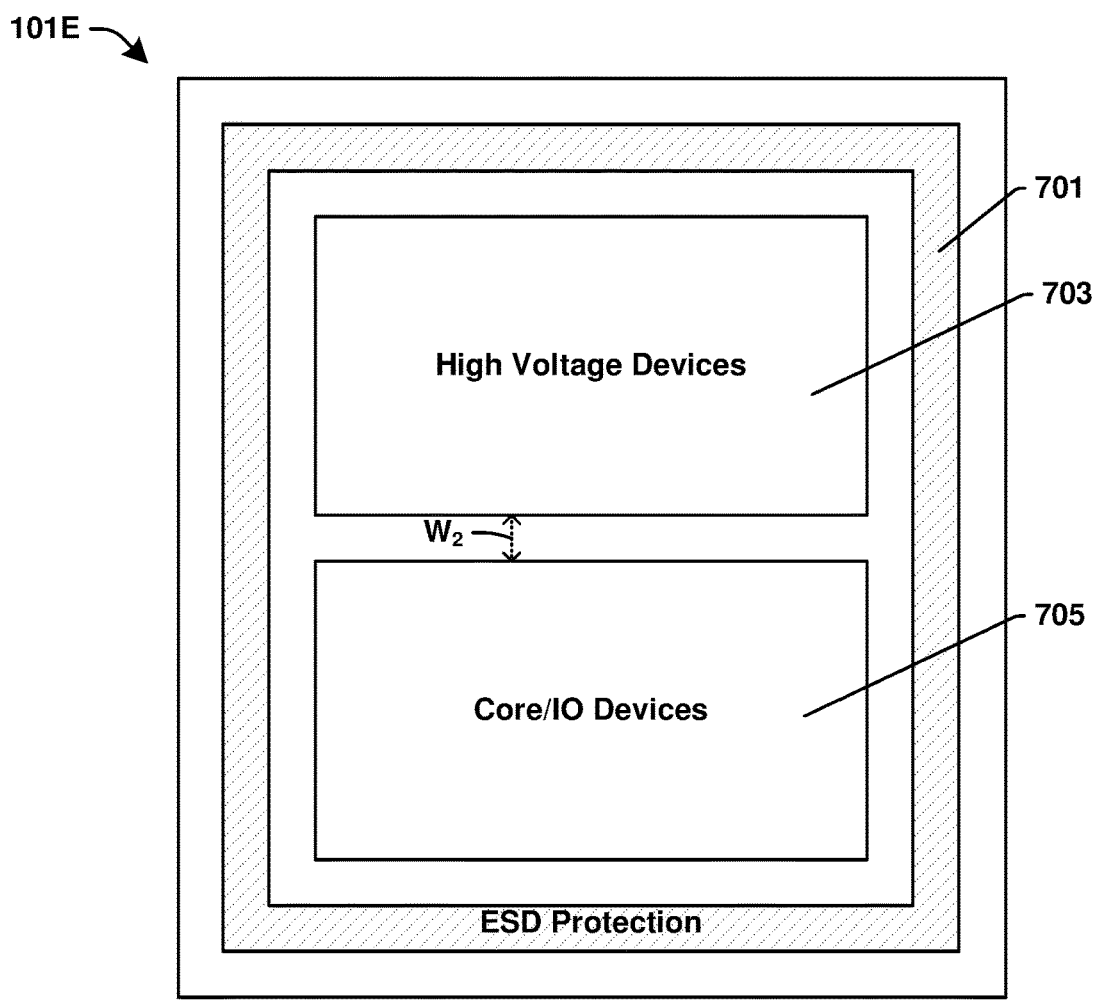
FIG. 7 illustrates the layout of an IC device in accordance with some aspects of the present disclosure.

FIG. 7 illustrates a layout for an IC device 101E according to some embodiments of the present disclosure. Any of the IC devices 101A-D could have the same layout as the IC device 101E. The IC device 101E includes a high voltage device area 703 and a core device area 705. The high voltage device area 703 include high voltages device such as the GAA transistors 125A-125D. High voltage devices include 5V transistors and may include higher voltage devices. The core device area includes logic and I/O devices. These may include devices that operate at 3.3V and devices that operate at 1.8V. The high voltage device area 703 and a core device area 705 are surrounded by an electrostatic discharge (ESD) protection structure 701 and are separated by a distance $W_2$, which may be about 1 μm or more.

Figure 8:
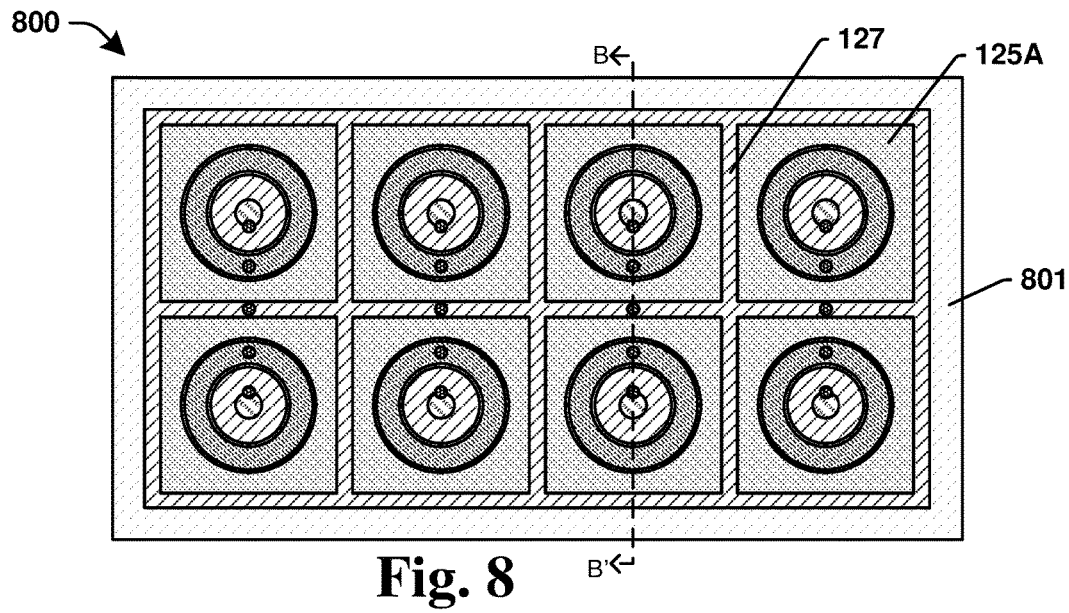
FIG. 8 illustrates an array of GAA transistors in accordance with some aspects of the present disclosure.

FIG. 8 provides a cross-sectional view of an array 800 of GAA transistors 125A that may be in the high voltage device area 703 of the IC device 101E of FIG. 7. As illustrated, adjacent GAA transistors 125A may share drain regions 127. Sharing drain regions 127 reduces a pitch of the array 800. The array 800 is surrounded by an isolation structure 801.

Figure 9:
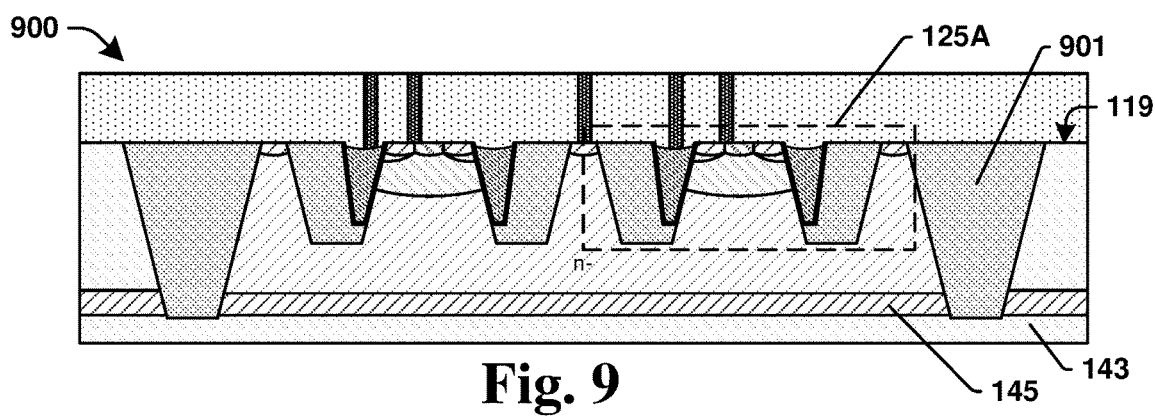
FIG. 9 illustrates a cross-sectional side view of the array of FIG. 8 with an isolation structure in accordance with some aspects of the present disclosure.

FIG. 9 provides a cross-sectional view 900 of the array 800 according to an embodiment in which the isolation structure 801 is provided by a deep trench isolation (DTI) structure 901. The cross-sectional view 900 is taken along the line B-B' of FIG. 8. As shown in FIG. 9, the DTI structure 901 extends from an upper surface 119 of the semiconductor substrate 143 to a depth that is greater than or equal to a depth of the buried N-layer 145.

Figure 10:
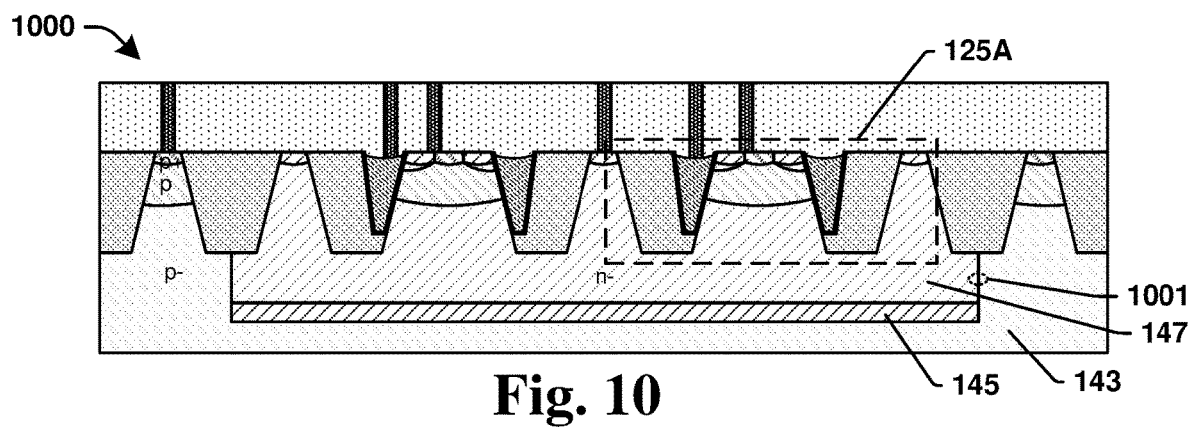
FIG. 10 illustrates a cross-sectional side view of the array of FIG. 8 with an isolation structure in accordance with some other aspects of the present disclosure.

FIG. 10 provides a cross-sectional view 1000 of the array 800 according to an embodiment in which the isolation structure 801 is provided by diodes including a PN junction 1001 formed between the upper semiconductor layer 147 and a bulk region of the semiconductor substrate 143. In this example, the buried N-layer 145 does not extend beyond the array 800.

FIGS. 11 through 20 are cross-sectional view illustrations exemplifying a method according to the present disclosure of forming a GAA transistor according to the present disclosure. While FIGS. 11 through 20 are described with reference to various embodiments of a method, it will be appreciated that the structures shown in FIGS. 11 through 20 are not limited to the method but rather may stand alone separate from the method. FIGS. 11 through 20 are described as a series of acts. The order of these acts may be altered in other embodiments. While FIGS. 11 through 20 illustrate and describe a specific set of acts, some may be omitted in other embodiments. Further, acts that are not illustrated and/or described may be included in other embodiments. While the method of FIGS. 11 through 20 is illustrated forming the GAA transistor 125A in the IC device 101A of FIG. 1, the method may be used to form other GAA transistors in other IC devices.

Figure 11:
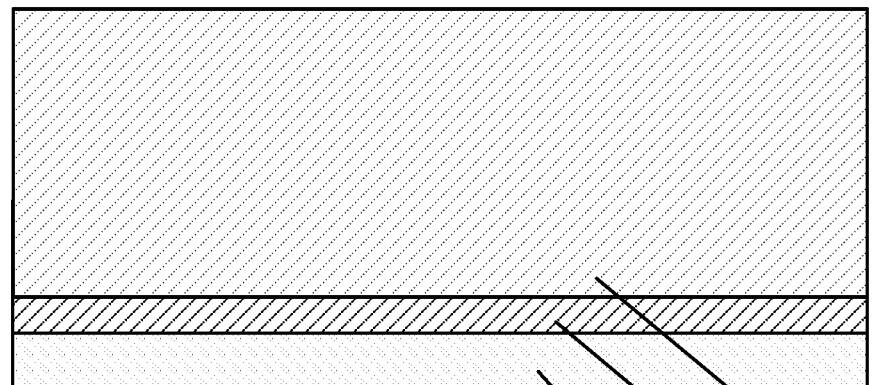
FIGS. 11-20 are a series of cross-sectional view illustrations exemplifying a method of the present disclosure for forming an IC device such as the IC device of FIG. 1.

As shown by the cross-sectional view 1100 of FIG. 11, the method may begin with providing the semiconductor substrate 143 with the buried N-layer 145 and the upper semiconductor layer 147. The semiconductor substrate 143 may be a bulk semiconductor substrate, an SOI substrate, the like, or some other suitable semiconductor substrate. The upper semiconductor layer 147 may be an epitaxial layer grown on the semiconductor substrate 143. The upper semiconductor layer 147 and the semiconductor substrate 143 may each be or comprise silicon, a group III-V semiconductor substrate, some other suitable semiconductor, the like, a combination of the foregoing, or any other suitable semiconductors. A bulk region of the semiconductor substrate 143 may be lightly p-doped. The upper semiconductor layer 147 may be lightly n-doped. Lightly doped may be doping to a concentration in the range from $10^{14}/cm^3$ to $10^{17}/cm^3$. As mentioned previously, the doping types may be reversed.

Figure 12:
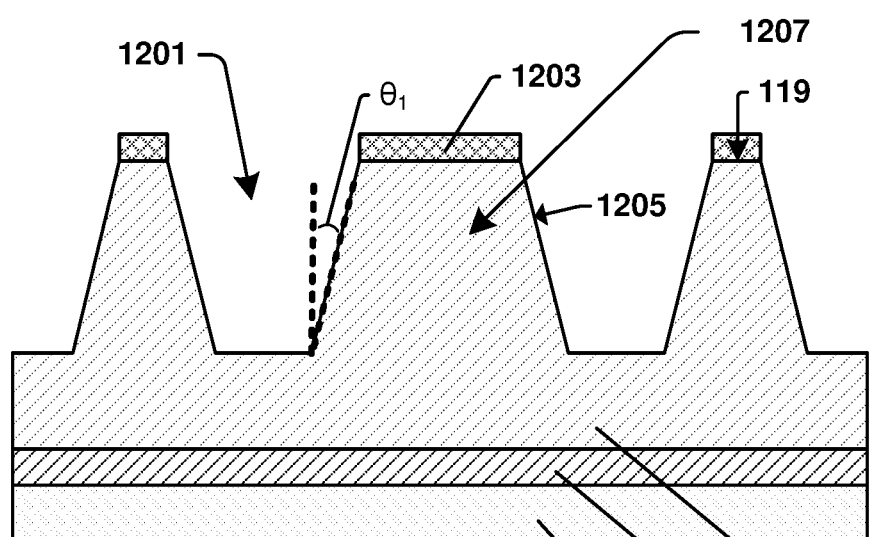

As shown by the cross-sectional view 1200 of FIG. 12, the method continues with forming trenches 1201. Forming the trenches 1201 may include forming a mask 1203 on the upper surface 119 and etching. The mask 1203 and other masks shown in the method of FIGS. 11-20 may be a photolithographic mask or a hard mask formed using photolithography. The etch process may be a dry etch such as a plasma etch or any other suitable process. As a result of the etch process, sidewalls 1205 of the trenches 1201 may form at an angle $\theta_1$ with respect to a perpendicular (a surface normal) of the upper surface 119. After the etch process, the mask 1203 may be stripped.

Figure 13:
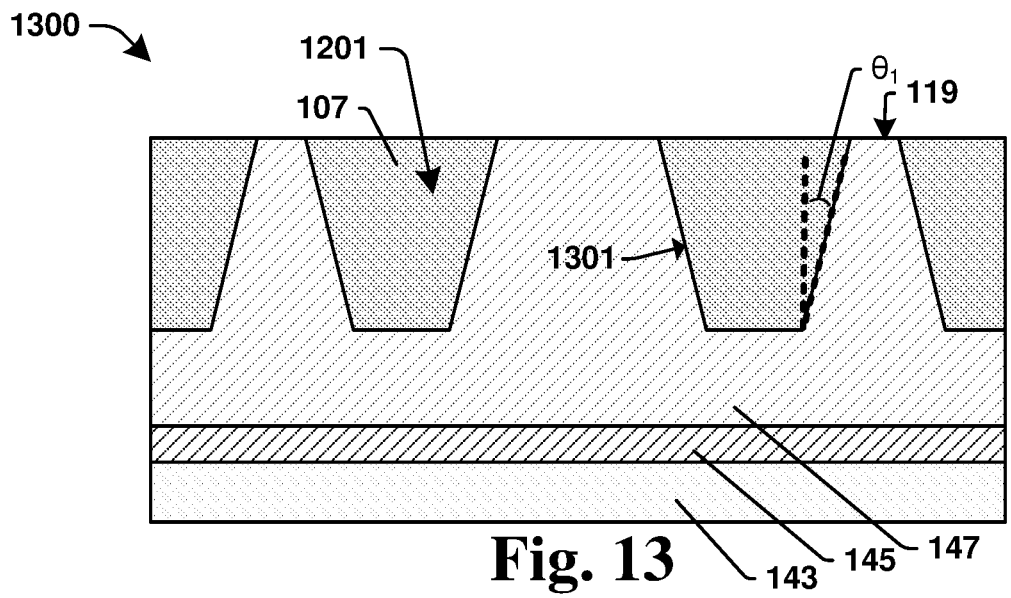

As shown by the cross-sectional view 1300 of FIG. 13, the trenches 1201 may be filled with dielectric to form STI regions 107. The dielectric may be a silicon oxide, the like, or any other suitable dielectric. The dielectric may be deposited by chemical vapor deposition (CVD), physical vapor deposition (PVD), the like, or any other suitable process. After depositing, excess dielectric may be removed by a planarization process. The planarization process may be chemical mechanical polishing (CMP). The STI regions 107 have sidewalls 1301 that form the angle $\theta_1$ with respect to (a surface normal of) the upper surface 119.

Figure 14:
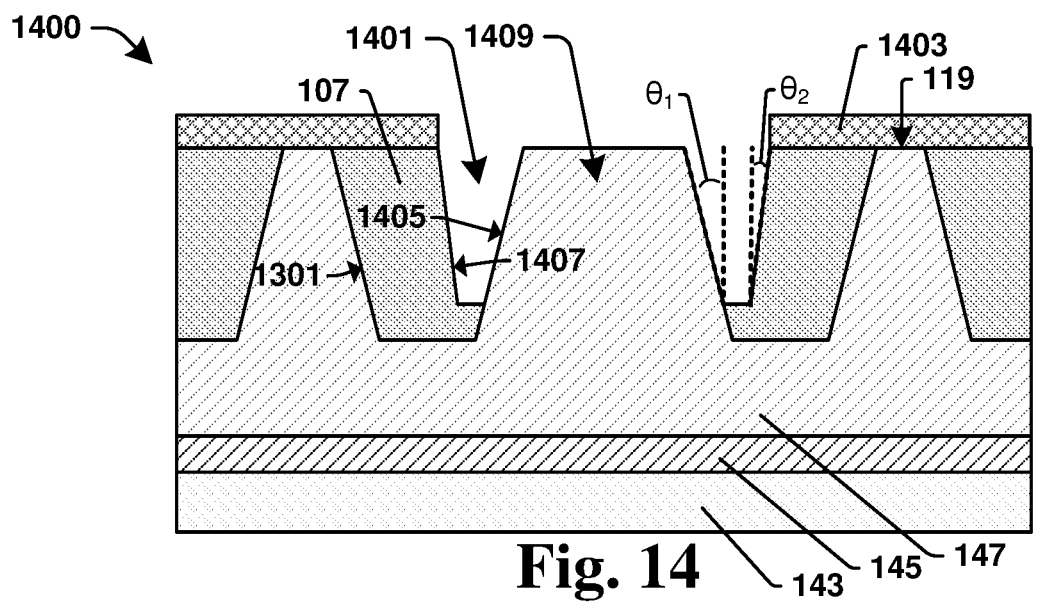

As shown by the cross-sectional view 1400 of FIG. 14, a mask 1403 may be formed and used to etch a trench 1401 in the STI regions 107. The etch process may be an etch that selectively removes the material of the STI regions 107 without removing the material of the upper semiconductor layer 147. The etch may be a wet etch or a dry etch. In some embodiments, the etch is a dry etch. The resulting trench 1401 may have a first sidewall 1405 that makes the angle $\theta_1$ with respect to the upper surface 119 and a second sidewall 1407 that forms a second angle $\theta_2$ with respect to the upper surface 119. The angle $\theta_2$ may be distinct from the angle $\theta_1$ due to the differences in process and materials. The trench 1401 surrounds an island 1409 of semiconductor material.

Figure 15:
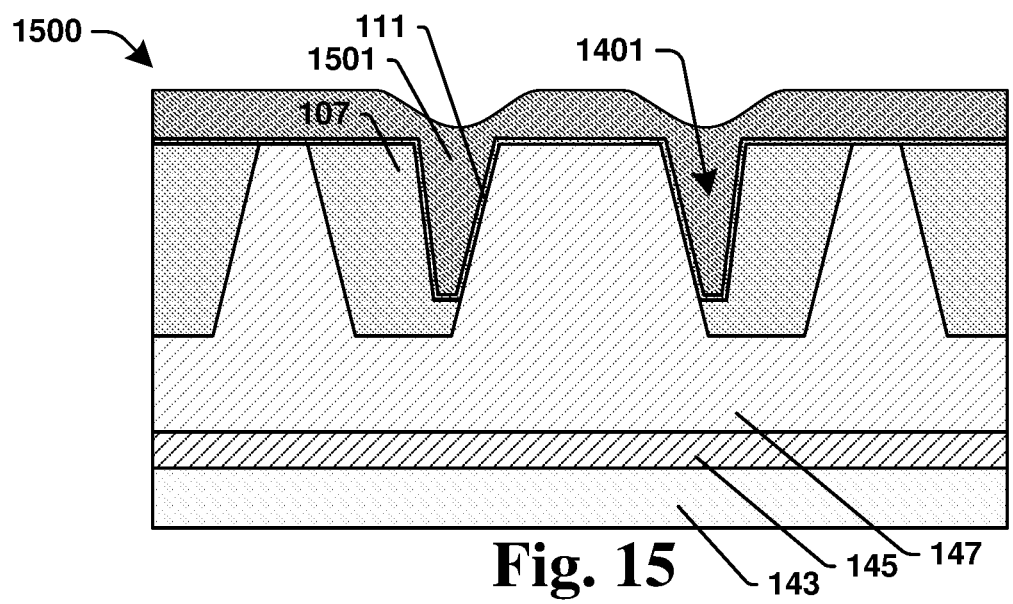

As shown by the cross-sectional view 1500 of FIG. 15 the trenches 1401 may be lined with the gate dielectric layer 111 then filled with conductive material 1501. The gate dielectric layer 111 may be or comprise silicon oxide, a high κ dielectric, the like, some other suitable dielectric(s), or any combination of the foregoing. The conductive material 1501 may be or comprise doped polysilicon, metal, the like, some other suitable conductive material, or a combination of the foregoing. In some embodiments the conductive material 1501 is doped polysilicon. In some embodiments the conductive material 1501 comprises a metal and the gate dielectric layer 111 is a high κ dielectric. In some embodiments, the gate dielectric layer 111 and the conductive material 1501 form a high voltage gate stack. In some embodiments, the gate dielectric layer 111 is formed by oxidation, in which case the gate dielectric layer 111 forms selectively on exposed surfaces of the upper semiconductor layer 147. In some embodiments, the gate dielectric layer 111 is formed by deposition. The deposition process may be atomic layer deposition (ALD), CVD, PVD, the like, or a combination of the foregoing. The conductive material 1501 may be deposited or grown. Examples of processes that may be suitable include, ALD, CVD, PVD, electroplating, and electroless plating.

Figure 16:
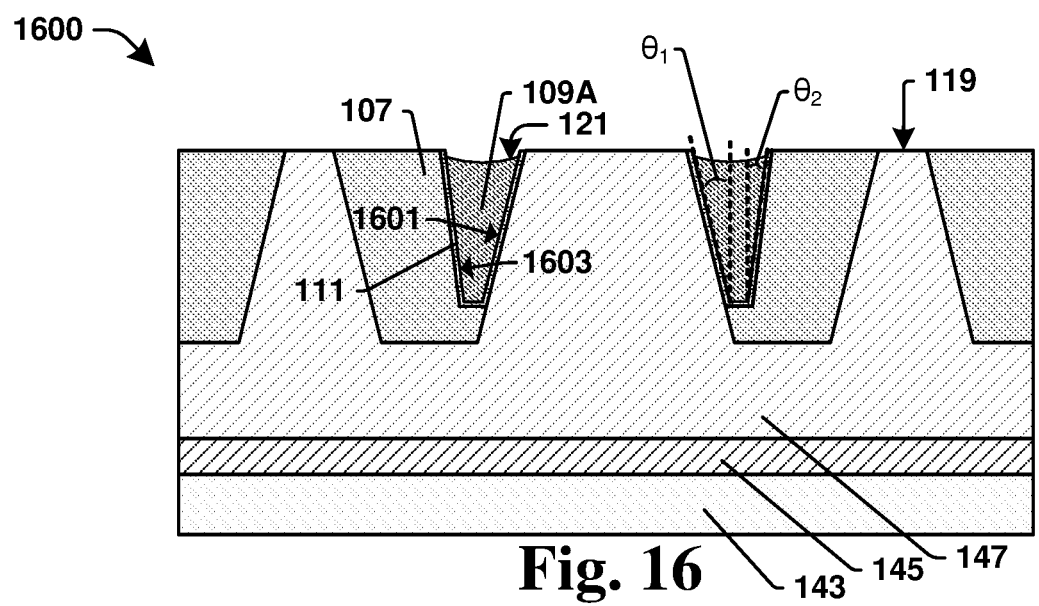

As shown by the cross-sectional view 1600 of FIG. 16, a process may be carried out to remove portions of the conductive material 1501 that are outside the area of the trenches 1401 and define the loop-shaped gate electrode 109A from the conductive material 1501. The loop-shaped gate electrode 109A has a first sidewall 1601 that forms the angle $\theta_1$ with respect to the upper surface 119 and a second sidewall 1603 that forms the second angle $\theta_2$ with respect to the upper surface 119.

In some embodiments the removal process is CMP, in which case the upper surface 121 of the loop-shaped gate electrode 109A will be approximately flush with the upper surface 119. In other embodiment like the one illustrated the process is an etch process. In some of these other embodiments, the etch process is a gate definition process that is carried out with a mask (see FIGS. 21-22, described more fully below) whereby portions of the conductive material 1501 remain above the upper surface 119 in locations other than the area shown to provide gates for devices distinct from the GAA transistor 125A of FIG. 1 or the like. The etch process may remove unmasked portions of the gate dielectric layer 111 from the upper surface 119. In some embodiments, the etch process comprises one or more steps of plasma etching. The etch process leaves the upper surface 121 recessed below the upper surface 119.

As shown by the cross-sectional view 1700 of FIG. 1700, a mask 1701 may be formed and ion implantation is carried out to provide p-type doping for the body region 137. In some embodiments the doping provides a dopant concentration in the range from $10^{15}/cm^3$ to $10^{18}/cm^3$. In some embodiments, the ion implantation provides shallow p-wells for bipolar junction transistors in areas that are not shown. In some embodiments, the ion implantation provides deep p-wells for NMOS transistors (not shown) in CMOS structures (not shown) within the core device area 705 (see FIG. 7). In other embodiments the p-type doping for the body region 137 is done separately and is tuned for GAA transistors according to the present disclosure.

As shown by the cross-sectional view 1800 of FIG. 1800, a mask 1801 may be formed and ion implantation carried out to provide heavy n-type doping for the source region 118 and the drain region 127. In some embodiments, the doping provides a dopant concentration in the range from $10^{20}/cm^3$ or greater. In some embodiments, the ion implantation also provides sources and drains for NMOS transistors (not shown) in the core device area 705 (see FIG. 7). The source extension region 135 may be formed by diffusion of dopants from the source region 118. Diffusion may be induced by thermal annealing. Alternatively, the source extension region 135 may be produced by another ion implantation using a higher energy level and a lower amount of dopant.

As shown by the cross-sectional view 1900 of FIG. 1900, a mask 1901 may be formed and ion implantation carried out to provide heavy p-type doping for the body contact region 117. In some embodiments, the doping provides a dopant concentration in the range from $10^{20}/cm^3$ or greater. In some embodiments, the ion implantation also provides sources and drains for PMOS transistors (not shown) in the core device area 705 (see FIG. 7). In some embodiments, the ion implantation is tailored specifically to provide desired characteristics for the GAA transistor 125A.

As shown by the cross-sectional view 2000 of FIG. 2000, the ILD layer 123 may be formed above the semiconductor substrate 143 followed by formation of a mask 2007 and using that mask to etch holes 2001, 2003, and 2005 through the ILD layer 123. The ILD layer 123 may be silicon oxide, a low k dielectric, the like, or some other suitable dielectric. The ILD layer 123 may be formed by ALD, CVD, the like, or any other suitable process. In some embodiments, the ILD layer 123 is formed from tetraethyl orthosilicate (TEOS). The holes 2001, 2003, and 2005 may be filled with conductive material followed by planarization to form the source contact plug 115, the gate contact plug 113, and the drain contact plug 105 respectively as shown in FIG. 1.

Figure 21:
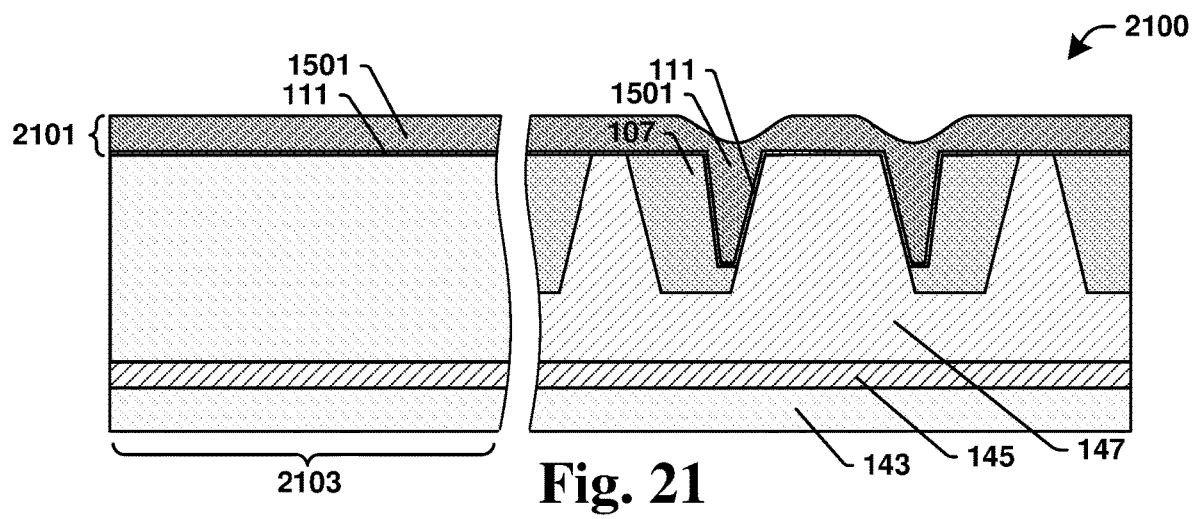
FIGS. 21-22 illustrate an embodiment of the method of FIGS. 11-20.
Figure 22:
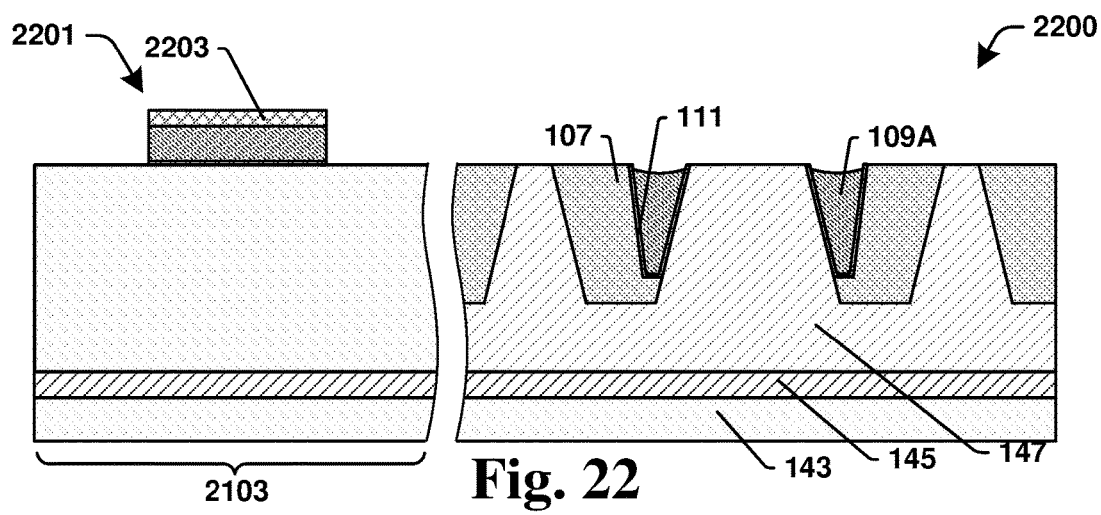

FIGS. 21 and 22 illustrate an embodiment of the foregoing method. In this embodiment a high voltage gate is formed in a device area 2103 simultaneously with the formation of the GAA transistor. The cross-sectional view 2100 of FIG. 21 extends the cross-sectional view 1500 of FIG. 15 to show that the gate dielectric layer 111 and the conductive material 1501 form a gate stack 2101 in the device area 2103. The cross-sectional view 2200 of FIG. 22 extends the cross-sectional view 1600 of FIG. 16 to show that a mask 2203 allows the same etch that defines the loop-shaped gate electrode 109A from the conductive material 1501 also defines a gate 2201 from the gate stack 2101.

Figure 23:
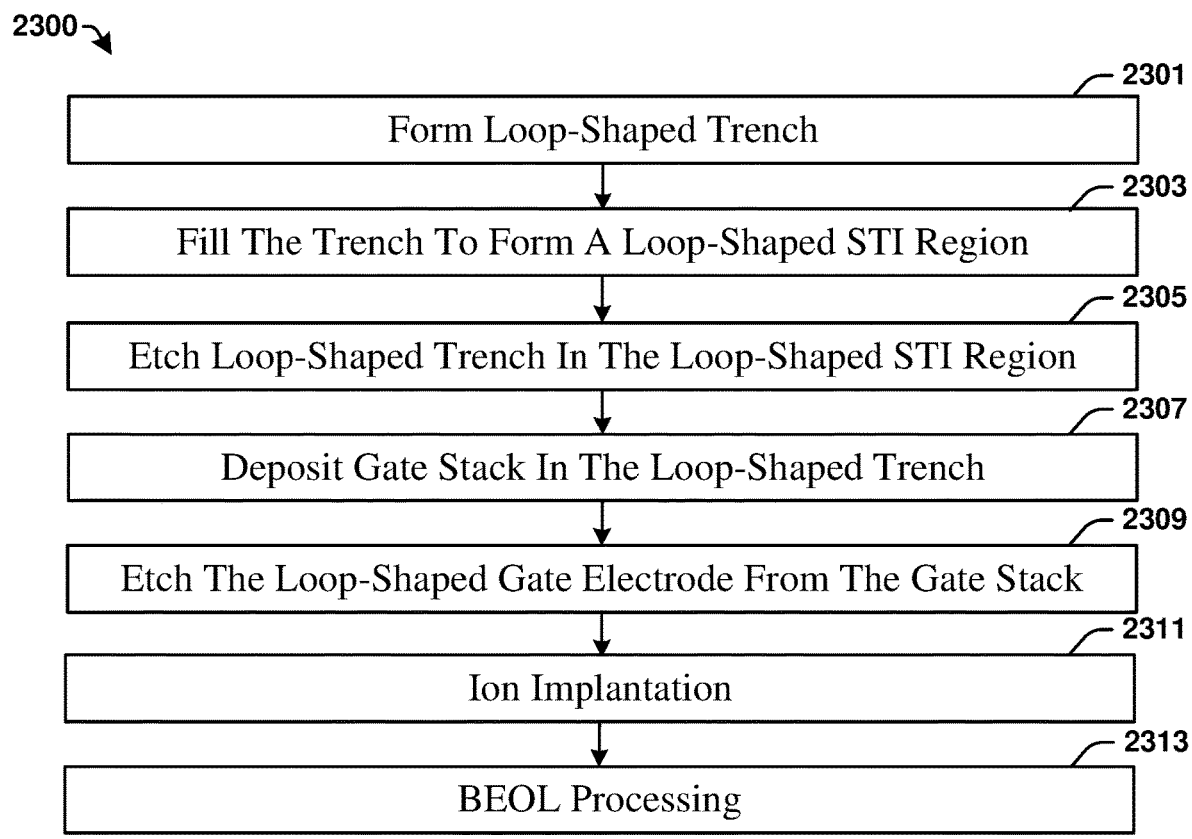
FIG. 23 provides a flow chart illustrating a method according to the present disclosure of forming an integrated circuit device including a GAA transistor according to the present disclosure.

FIG. 23 presents a flow chart for a process 2300 that may be used to form an IC device having a GAA transistor according to the present disclosure. While the process 2300 of FIG. 23 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 2300 may begin with act 2301, forming a first loop-shaped trench in a semiconductor. The cross-sectional view 1200 of FIG. 12 provides an example. The trench 1201 is loop-shaped in the sense that it surrounds an island 1207 of semiconductor. Loop-shaped is not restricted to any narrow sense of being circular or cylindrical but is meant in the broader sense of being present about a 360 degree perimeter. For example, the STI region 107 as shown by the plan view of FIG. 2 is loop-shaped.

The process continues with act 2303, filling the first loop-shaped trench with dielectric to form a loop-shaped STI region. The cross-sectional view 1300 of FIG. 13 provides an example. The process of filling the trench may include both deposition and planarization. Other STI regions that are not loop-shaped may be formed simultaneously with the loop-shaped STI region.

The process continues with act 2305, etching a second loop-shaped trench. The second loop-shaped trench is etched out of the loop-shaped STI region. The cross-sectional view 1400 of FIG. 14 provides an example. The island of semiconductor surrounded by the ring-shapes STI region may provide an inner sidewall for the second loop-shaped trench. The inner sidewall of the second loop-shaped trench may have a slope that is a mirror image of a slope in an outer sidewall of the first loop-shaped structure. The STI region may provide an outer sidewall for the second loop-shaped trench. A slope of the outer sidewall of the second loop-shaped trench may be at a distinct angle from that of the inner sidewall of the second loop-shaped trench.

The process continues with act 2307, forming a gate stack. The gate stack fills the second loop-shaped trench. The cross-sectional views 1500 and 2100 of FIGS. 15 and 21 provide examples. The gate stack includes a gate dielectric layer and a gate electrode layer. In some embodiments, the gate stack is a high κ metal (HKMG) gate stack.

The process continues with act 2309, etching to define a loop-shaped gate electrode from the ring shaped gate stack. The cross-sectional views 1600 and 2200 of FIGS. 16 and 22 provide examples. In some embodiments, the etch process causes the loop-shaped gate electrode to be recessed below an upper surface of the semiconductor substrate. In some embodiments, the etch process is maskless in the area of the GAA transistor. In some embodiments, a mask is formed for the etch process and the etch process defines a gate electrode for a device that has a gate electrode above a surface of the semiconductor substrate.

Figure 17:
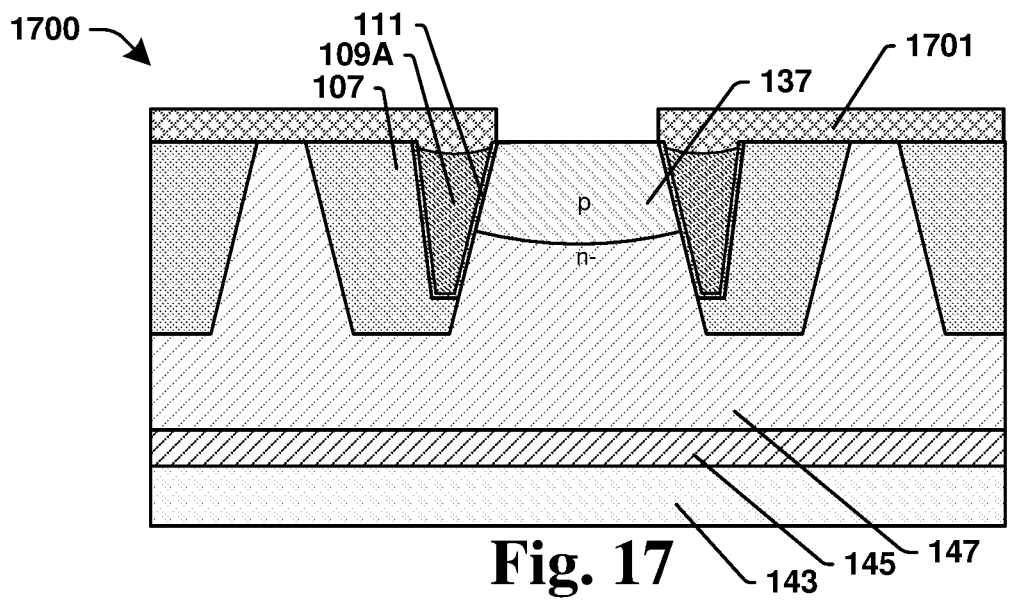
Figure 18:
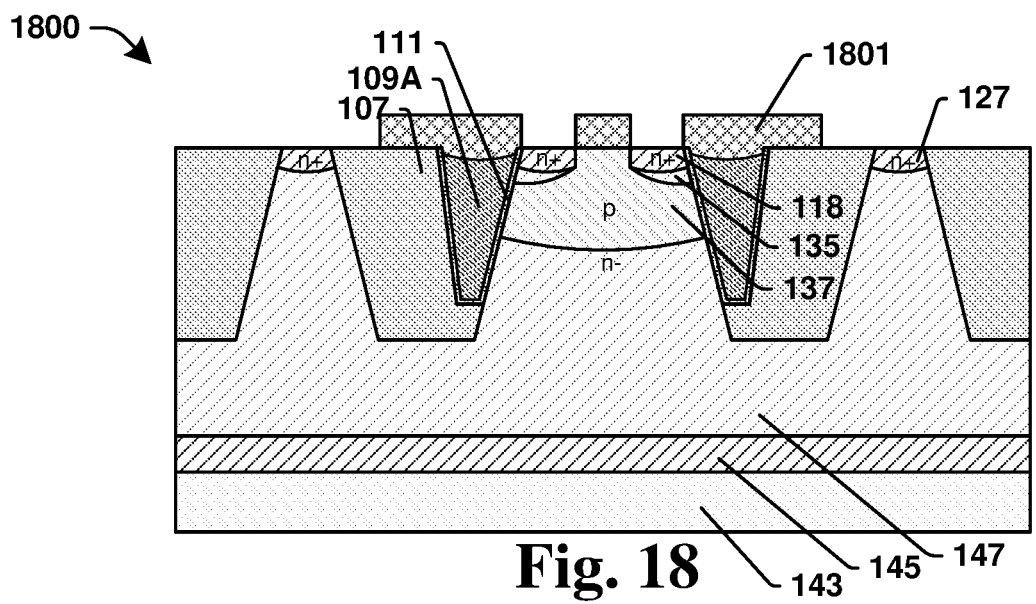
Figure 19:
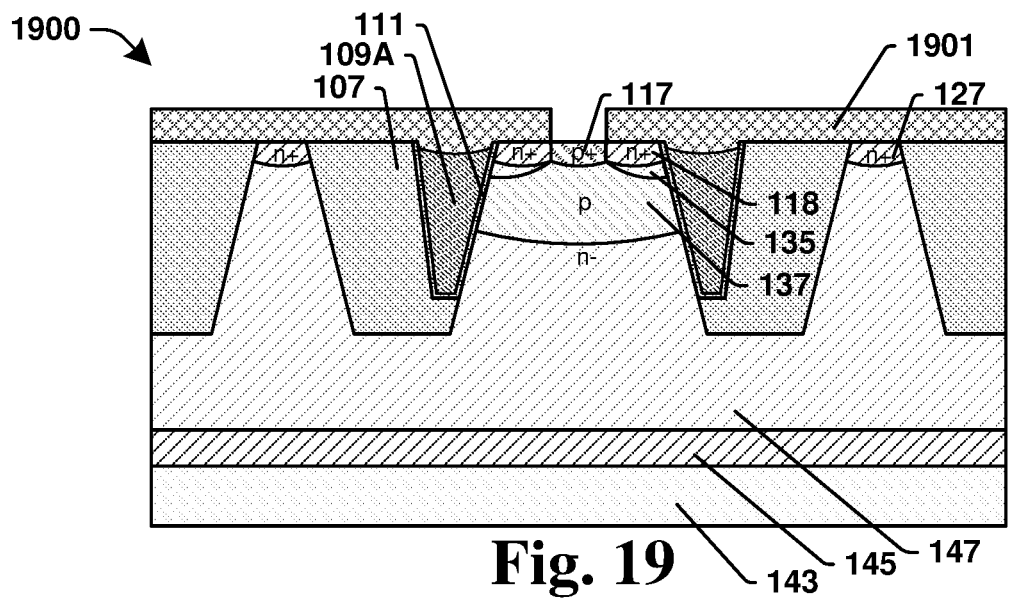
Figure 20:
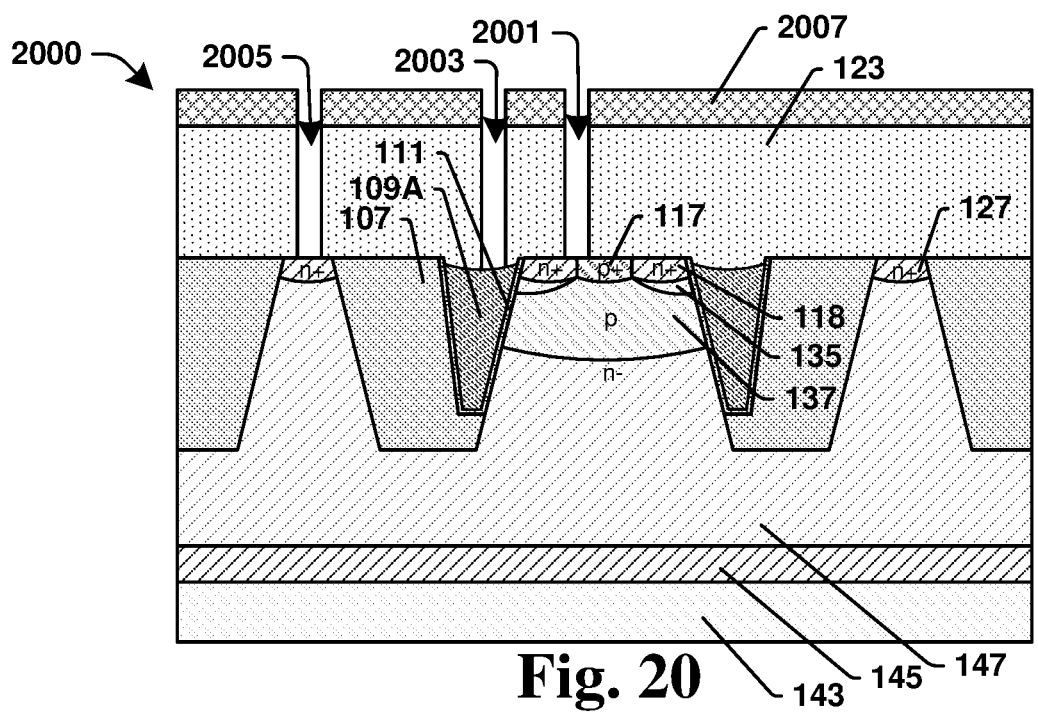

The process continues with act 2311, ion implantation. Ion implantation may include a series of steps. The cross-sectional views 1700-1900 of FIGS. 17-19 provide an example. The ion implantation provides source and drain regions from the GAA transistor. In some embodiments, the ion implantation forms a body contact region that is butted with an inner terminal (source or drain) region for the GAA transistor. In some embodiments, the ion implantation produces a well that provides a channel for the GAA transistor. In some embodiment, one or more of these implants provides wells or contact regions for other high voltage devices including bipolar junction devices. In some embodiment, one or more of these implants provides wells or contact regions for CMOS devices in a core, I/O, or logic region apart from a high voltage region that contains the GAA transistor.

The process continues with act 2313, back-end-of-line (BEOL) processing. BEOL processing begins with the formation of contact plugs for the source region, the drain region, and the gate electrode of the GAA transistor. The cross-sectional view 2000 of FIG. 20 together with FIG. 1 provides an example. BEOL processing forms a metal interconnect over the semiconductor substrate.

Some aspects of the present disclosure relate to an IC device having a transistor. The transistor has a loop-shaped gate electrode, a first source/drain region, a second source/drain region, and a channel that are doped regions of a semiconductor substrate. The loop-shaped gate electrode is separated from the channel by a gate dielectric layer and is below an upper surface of the semiconductor substrate. The channel is surrounded by the loop-shaped gate electrode and the second source/drain region is outside the loop-shaped gate electrode. In some embodiments the loop-shaped gate electrode is inside a loop-shaped STI region.

In some embodiments, the loop-shaped STI region has approximately the same depth as the loop-shaped gate electrode. In other embodiments, the loop-shaped STI region goes deeper than the loop-shaped gate electrode. The some embodiments, the loop-shaped STI region is slanted with an angle that mirrors that of an inner sidewall of the loop-shaped gate electrode. In some embodiments, an inner sidewall of the loop-shaped gate electrode is inclined with respect to a surface normal of the upper surface by a first angle and an outer sidewall of the loop-shaped gate electrode is inclined with respect to the surface normal by a second angle that is distinct from the first angle. In some embodiments, a top of the loop-shaped gate electrode is recessed below a surface of the substrate. In some embodiments, a contact for the body of the transistor is butted with the first source/drain region. In some embodiments, the transistor has a high-k dielectric and a metal gate. In some embodiments, the loop-shaped gate electrode has an inner side with a circular horizontal cross-section. In some embodiments, the loop-shaped gate electrode has an inner side with a rectangular or square horizontal cross-section.

Some aspects of the present disclosure relate to an IC device comprising an STI region and a transistor. The transistor has, an inner terminal region, a channel, an outer terminal region, a gate electrode, and a drift region. The inner terminal region is above the channel and the gate electrode surrounds the channel. The STI region surrounds the gate electrode. The outer terminal region is outside a periphery of the STI region. The drift region begins underneath the channel, goes underneath the STI region, and extends to the outer terminal region. One of the inner terminal region and the outer terminal region is operative as a source, the other as a drain. In some embodiments, the transistor is form directly over a buried N-layer in a semiconductor substrate. In some embodiments the transistor is in an array that is surrounded by a DTI region that extends down to the buried N-layer. In some embodiments, the array N-well that extends from a surface of the semiconductor substrate to the buried N-layer.

Some aspects of the present disclosure relate to a method of forming an IC device comprising a transistor. The method includes forming a loop-shaped shallow trench isolation (STI) region within a semiconductor substrate, etching away a portion of the loop-shaped STI region to form a loop-shaped trench comprising an outer sidewall that is provided by the STI region and an inner sidewall that is provided by the semiconductor substrate, forming a gate oxide on the inner sidewall, filling the trench with a conductive material, doping a portion of the semiconductor substrate that has a first doping type and is disposed within the loop-shaped STI region to form a well having a second doping type, and doping a portion of the semiconductor substrate directly over the well to form a heavily doped region having the first doping type. In some embodiments, the well has a depth that is less than a depth of the STI region. In some embodiments, the conductive material is deposited to fill the trench followed by an etch process that causes the conductive material to be recessed within the loop-shaped trench. In some embodiments, the etch process leave a masked portion of the conductive material to form a gate electrode that is above the surface of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a loop-shaped shallow trench isolation (STI) region within a semiconductor substrate;
   etching away a portion of the loop-shaped STI region to form a loop-shaped trench comprising an outer sidewall that is provided by the loop-shaped STI region and an inner sidewall that is provided by the semiconductor substrate;
   forming a gate oxide on the inner sidewall;
   filling the loop-shaped trench with a conductive material;
   doping a portion of the semiconductor substrate having a first doping type and disposed within the loop-shaped STI region to form a well having a second doping type, wherein the second doping type is opposite the first doping type and a depth of the well is less than a depth of the loop-shaped STI region; and
   doping a portion of the semiconductor substrate directly over the well to form a heavily doped region having the first doping type.

2. The method of claim 1, wherein filling the loop-shaped trench with a conductive material comprises:
   depositing the conductive material; and
   etching with an etch process that has a higher etch rate for the conductive material than for a dielectric that forms the loop-shaped STI region; and
   wherein the etching recesses the conductive material within the loop-shaped trench.

3. The method of claim 2, wherein the etching leaves some of the conductive material that was covered by a mask to form a gate electrode that is above a surface of the semiconductor substrate.

4. A method, comprising:
   forming a shallow trench isolation (STI) region within a semiconductor substrate, wherein a first area of the semiconductor substrate is surrounded by the STI region and a second area of the semiconductor substrate surrounds the STI region and the first area;
   etching a portion of the STI region to form a trench, wherein the semiconductor substrate is exposed within the trench and the trench is surrounded by the STI region;
   forming a gate dielectric layer on the semiconductor substrate exposed within the trench;
   depositing a gate electrode layer over the gate dielectric layer, wherein a portion of the gate electrode layer is within the trench;
   while the second area is masked, doping to form a well in the first area, wherein the well has a first doping type and the well has a lesser depth than the STI region; and
   forming a first source/drain region and a second source/drain region by doping areas of the semiconductor substrate, wherein the first source/drain region and the second source/drain region have a second doping type, which is opposite the first doping type, the first source/drain region is in the first area and above the well, and the second source/drain region is in the second area.

5. The method of claim 4, wherein the trench has a lesser depth than the STI region.

6. The method of claim 5, wherein the well has a lesser depth than the trench.

7. The method of claim 4, wherein the STI region has an aspect ratio of 2:1 or less.

8. The method of claim 4, wherein the well forms a PN junction with the semiconductor substrate beneath the well.

9. A method, comprising:
   etching a first trench in a semiconductor substrate, wherein the first trench forms a closed loop having an inner side and an outer side;
   filling the first trench with dielectric to form an isolation structure;
   etching the isolation structure to form a second trench, wherein the second trench forms a closed loop, an outer sidewall of the second trench is the isolation structure, and an inner sidewall of the second trench is the semiconductor substrate;
   forming a gate dielectric layer on the inner sidewall of the second trench;
   depositing a gate electrode layer to form a gate electrode for a lateral double-diffused metal-oxide semiconductor transistor, wherein the gate electrode is in the second trench;
   doping a first area of the semiconductor substrate abutting the inner side while a second area of the semiconductor substrate abutting the outer side is masked to form a well in the first area, wherein the well has a first doping type and the well has a lesser depth than the isolation structure; and forming a first source/drain region and a second source/drain region for the lateral double-diffused metal-oxide semiconductor transistor by doping areas of the semiconductor substrate, wherein the first source/drain region and the second source/drain region have a second doping type, which is opposite the first doping type, the first source/drain region is in the first area and above the well, and the second source/drain region is in the second area, and the lateral double-diffused metal-oxide semiconductor transistor has a drift region a portion of which is disposed beneath the isolation structure.

10. The method of claim 9, further comprising forming a contact region for the well within the first area.

11. The method of claim 9, wherein the second trench is shallower than the first trench.

12. The method of claim 9, wherein forming the gate electrode for lateral double-diffused metal-oxide semiconductor transistor comprises depositing a gate electrode layer and chemical mechanical polishing to remove a portion of the gate electrode layer that is outside the second trench.

13. The method of claim 9, wherein forming the gate electrode for lateral double-diffused metal-oxide semiconductor transistor comprises depositing a gate electrode layer and etching the gate electrode layer to remove a portion of the gate electrode layer that is outside the second trench.

14. The method of claim 13, wherein a portion of the gate electrode layer is masked while etching to define the gate electrode.

15. The method of claim 14, wherein etching confines the gate electrode to a height at or below a surface of the semiconductor substrate.

16. The method of claim 15, wherein etching confines the gate electrode below a surface of the semiconductor substrate.

17. The method of claim 9, wherein the gate electrode has an inner side with a circular horizontal cross-section.

18. The method of claim 9, wherein the gate electrode has an inner side with a rectangular horizontal cross-section.

19. The method of claim 9, wherein the gate dielectric layer is a high κ dielectric and the gate electrode is metal.

20. The method of claim 9, wherein the first trench has an aspect ratio of 2:1 or less.

* * * * *